United States Patent
Zeng et al.

(10) Patent No.: US 12,514,026 B2
(45) Date of Patent: Dec. 30, 2025

(54) TRANSPARENT LAMINATED PASSIVATION FILM STRUCTURE, AND PREPARATION METHOD AND APPLICATION THEREOF

(71) Applicant: Teranergy Technology Co., Ltd., Ningbo (CN)

(72) Inventors: Yuheng Zeng, Ningbo (CN); Zunke Liu, Ningbo (CN); Jichun Ye, Ningbo (CN); Yali Ou, Ningbo (CN); Hongkai Zhou, Ningbo (CN); Mingdun Liao, Ningbo (CN); Wei Liu, Ningbo (CN)

(73) Assignee: Teranergy Technology Co., Ltd., Ningbo (CN)

( * ) Notice: Subject to any disclaimer, the term of this patent is extended or adjusted under 35 U.S.C. 154(b) by 0 days.

(21) Appl. No.: 19/250,229

(22) Filed: Jun. 26, 2025

(65) Prior Publication Data

US 2025/0324817 A1    Oct. 16, 2025

Related U.S. Application Data

(63) Continuation of application No. PCT/CN2024/136318, filed on Dec. 3, 2024.

(30) Foreign Application Priority Data

Jan. 12, 2024    (CN) .......................... 202410044219.5

(51) Int. Cl.
*B32B 15/04*    (2006.01)
*B32B 17/06*    (2006.01)
(Continued)

(52) U.S. Cl.
CPC ......... *H10F 77/311* (2025.01); *H10F 71/129* (2025.01); *C23C 16/24* (2013.01); *C23C 16/56* (2013.01)

(58) Field of Classification Search
CPC ..................................................... H10F 71/129
(Continued)

(56) References Cited

U.S. PATENT DOCUMENTS 10,991,834 B1 *    4/2021    Li ........................ H10F 77/311
10,991,838 B1 *    4/2021    Yang .................... H10F 77/484
(Continued)

FOREIGN PATENT DOCUMENTS

CN    113904645 A    1/2022
CN    115274890 A    11/2022
(Continued)

*Primary Examiner* — Lauren R Colgan
(74) *Attorney, Agent, or Firm* — Bayramoglu Law Offices LLC (57) ABSTRACT

A transparent laminated passivation film structure and a preparation method and application thereof are provided. The transparent laminated passivation film structure includes a first passivation layer, a second passivation layer, and a third passivation layer sequentially laminated on a surface of a silicon substrate. The material of the first passivation layer is a hydrogenated silicon oxide film. The material of the second passivation layer is one selected from a hydrogenated silicon carbon nitride film, a hydrogenated silicon carbide film, a hydrogenated silicon nitride film, a hydrogenated silicon carbon nitride oxide film, a hydrogenated silicon carbide oxide film, and a hydrogenated silicon nitride oxide film. The material of the third passivation layer is one or a laminated film of more selected from a hydrogenated aluminum oxide film, a hydrogen-containing silicon nitride film, and a hydrogenated silicon oxide film. The transparent laminated passivation film structure has excellent surface and bulk passivation effects.

20 Claims, 8 Drawing Sheets

(51) Int. Cl.
    *H10F 71/00*     (2025.01)
    *H10F 77/30*     (2025.01)
    *C23C 16/24*     (2006.01)
    *C23C 16/56*     (2006.01)

(58) Field of Classification Search
    USPC ........................................ 428/698, 699, 701
    See application file for complete search history.

(56) References Cited

U.S. PATENT DOCUMENTS

| | | | |
|---|---|---|---|
| 2015/0021599 A1* | 1/2015 | Ridgeway | C23C 16/402 |
| | | | 257/43 |
| 2016/0276519 A1* | 9/2016 | Zhu | H01L 21/0214 |
| 2021/0005774 A1* | 1/2021 | Cabal | H10F 71/129 |
| 2023/0078580 A1* | 3/2023 | Li | H10F 71/129 |
| | | | 136/251 |
| 2023/0137353 A1* | 5/2023 | Li | H10F 77/311 |
| | | | 136/256 |

FOREIGN PATENT DOCUMENTS

| | | |
|---|---|---|
| CN | 118073430 A | 5/2024 |
| WO | 2022142343 A1 | 7/2022 |

\* cited by examiner

TRANSPARENT LAMINATED PASSIVATION FILM STRUCTURE, AND PREPARATION METHOD AND APPLICATION THEREOF

CROSS REFERENCE TO THE RELATED APPLICATIONS

This application is a continuation application of International Application No. PCT/CN2024/136318, filed on Dec. 3, 2024, which is based upon and claims priority to Chinese Patent Application No. 202410044219.5, filed on Jan. 12, 2024, the entire contents of which are incorporated herein by reference.

TECHNICAL FIELD

The present invention relates to the technical field of surface passivation of silicon-based semiconductor devices, in particular to a transparent laminated passivation film structure and a preparation method and application thereof.

BACKGROUND

Surface passivation is a key factor to improve the performance of silicon-based semiconductor devices. For solar cell devices, surface passivation is the most important factor to improve their photoelectric conversion efficiency. Every improvement of solar cell conversion efficiency actually depends on the improvement of passivation quality on the surface of passivation film. For example, the efficiency of a p-type passivated emitter and rear cell (PERC) solar cell is higher than that of a p-type aluminum back surface field (Al-BSF) solar cell, because AlOx/SiNx or $SiO_xN_y$ film is used to passivate the back surface of the silicon wafer, which significantly reduces carrier recombination on the back surface.

Saturation current density ($J_0$) and implied open-circuit voltage ($iV_{oc}$) are physical quantities characterizing surface recombination. $J_0$ represents the magnitude of surface recombination, and the smaller this value, the lower the surface recombination. The difference between $iV_{oc}$ and $J_0$ is that $iV_{oc}$ can characterize both surface recombination and bulk recombination, and the higher the $iV_{oc}$ value, the lower the surface recombination and bulk recombination. The saturation current density of passivation film on different silicon wafers will vary with the change of silicon wafer resistivity.

At present, the common passivation films of silicon solar cell technology include $AlO_x/SiN_x$, $SiO_x/SiN_x$, $SiO_x/SiN_x/SiO_x$, i-a-Si:H (or i-μc-Si:H) and so on. $AlO_x/SiN_x$ laminated passivation film is commonly used in PERC cells, and the optimal passivation index on a non-diffused p-type or n-type silicon wafer is about 2 $fA/cm^2$. $SiO_x/SiN_x$ and $SiO_x/SiN/SiO_x$ are commonly used in phosphorus diffusion emitters, where $SiO_x/SiN/SiO_x$ has a better passivation effect than $SiO_x/SiN_x$. The optimal passivation indexes of $SiO_x/SiN/SiO_x$ on a non-diffused n-type planar silicon wafer are about 1 $fA/cm^2$ (high-resistance silicon wafer with a resistivity of about 90 Ω·cm) and 4.7 $fA/cm^2$ (industrial low-resistance silicon wafer with a resistivity of about 3 Ω·cm), respectively. The optimal passivation index of $SiO_x/SiN/SiO_x$ on a non-diffused n-type randomly textured silicon wafer is about 3 $fA/cm^2$ (high-resistance silicon wafer with a resistivity of about 90 Ω·cm). i-a-Si:H (or i-μc-Si:H) has the best passivation performance, and the optimal passivation index on a non-diffused n-type or p-type silicon wafer is about 0.5 $fA/cm^2$ (industrial low-resistance silicon wafer with a resistivity of about 1 Ω·cm), but its parasitic absorption is serious.

In summary, the passivation quality of passivation film is the key factor that restricts the improvement of open-circuit voltage ($V_{oc}$) of crystalline silicon solar cells. How to further improve the passivation quality and reduce the saturation current density is the key to improving the efficiency of silicon solar cells.

SUMMARY

The present invention aims at developing a new surface passivation structure, reducing the saturation current density of silicon wafers, and improving the passivation quality of silicon-based semiconductor devices.

In order to achieve the above objectives, a first aspect of the present invention provides a transparent laminated passivation film structure, which includes a first passivation layer, a second passivation layer, and a third passivation layer sequentially laminated on a surface of a silicon substrate. The material of the first passivation layer is a hydrogenated silicon oxide film. The material of the second passivation layer is one selected from a hydrogenated silicon carbon nitride film, a hydrogenated silicon carbide film, a hydrogenated silicon nitride film, a hydrogenated silicon carbon nitride oxide film, a hydrogenated silicon carbide oxide film, and a hydrogenated silicon nitride oxide film. The material of the third passivation layer is one or a laminated film of more selected from a hydrogenated aluminum oxide film, a hydrogen-containing silicon nitride film, and a hydrogenated silicon oxide film.

The transparent laminated passivation film structure of the present invention has excellent surface passivation and bulk passivation effects, can significantly reduce a saturation current density on the surface of the silicon wafer and prolong the minority carrier life ($\tau_{eff}$) of the silicon wafer bulk, and the saturation current density on the surface of the silicon wafer can be as low as 0.2 $fA/cm^2$, which is obviously superior to various passivation film structures in the prior art and can prolong the minority carrier life of the market mainstream n-type silicon wafer bulk (1-7 Ω·cm) to more than 15 ms.

Furthermore, the silicon substrate contains a hydrogen element and at least one of a carbon element and a nitrogen element, and the concentration of each element gradually decreases from the surface to the body.

Furthermore, the hydrogen concentration on the surface of the silicon substrate is $1\times10^{19}$ $cm^{-3}$–$1\times10^{21}$ $cm^{-3}$. Carbon and nitrogen atoms can effectively capture hydrogen atoms and inject them into the substrate and interface to passivate more defect states.

Furthermore, the nitrogen concentration on the surface of the substrate is $1\times10^{19}$ $cm^{-3}$–$1\times10^{22}$ $cm^{-3}$, and/or the carbon concentration is $1\times10^{19}$ $cm^{-3}$–$1\times10^{22}$ $cm^{-3}$. The introduction of carbon, nitrogen, oxygen, and other elements into the near surface of a silicon wafer can improve the mechanical properties of the silicon wafer.

Furthermore, the hydrogen concentration of the first passivation layer is $1\times10^{19}$ $cm^{-3}$–$1\times10^{22}$ $cm^{-3}$, the hydrogen concentration of the second passivation layer is $1\times10^{19}$ $cm^{-3}$–$1\times10^{22}$ $cm^{-3}$, and the hydrogen concentration of the third passivation layer is $1\times10^{19}$ $cm^{-3}$–$1\times10^{22}$ $cm^{-3}$. Each passivation layer has a high hydrogen concentration and good chemical stability, and can achieve excellent surface protection for silicon wafers.

Furthermore, the refractive index of the second passivation layer is 1.0-5.0. The refractive index of the second passivation layer can be controlled by composition adjustment.

Furthermore, the transmittance of the first passivation layer at wavelengths above 400 nm is greater than 97%, and the transmittance of the second passivation layer at wavelengths above 400 nm is greater than 97%. The transparent laminated passivation film structure has extremely low absorption at wavelengths above 400 nm and has extremely low optical absorption characteristics.

Furthermore, the thickness of the first passivation layer is 1-20 nm, preferably 1-5 nm, and the thickness of the second passivation layer is greater than or equal to 2 nm, preferably 3-100 nm.

The transparent laminated passivation film structure of the present invention can realize controllable adjustment of optical absorption and transmission characteristics by adjusting the refractive index of the second passivation layer, the film thickness, and the like.

A second aspect of the present invention provides a preparation method of the transparent laminated passivation film structure, which includes the following steps:

S1, cleaning a silicon substrate;

S2, preparing a silicon oxide film on a surface of the silicon substrate;

S3, depositing an amorphous silicon film containing carbon and/or nitrogen elements on the silicon oxide film;

S4, carrying out a high-temperature annealing treatment at a temperature of 600° C.-1200° C. to convert the amorphous silicon film into a polycrystalline silicon film;

S5, depositing one or a laminated film of more selected from of aluminum oxide, silicon nitride, and silicon oxide on the polycrystalline silicon film; and S6, carrying out a hydrogen injection treatment.

The preparation method of the transparent laminated passivation film structure of the present invention is completely compatible with the prior battery production line technology and has a good mass production application prospect. The passivation film structure has good thermal stability, and the passivation quality of the passivation film structure will not be affected by the temperature within the temperature range of not more than 500° C.

Furthermore, in step S6, an annealing treatment is adopted for hydrogenation; the treatment temperature is 300° C.-1000° C., and the protective atmosphere contains inert gas such as nitrogen, preferably a mixed gas of nitrogen and hydrogen. Forming gas annealing (FGA) treatment is preferred for hydrogen injection, and hydrogen injection can also be realized by the sintering process.

Furthermore, in step S3, the amorphous silicon film containing carbon and/or nitrogen elements is deposited in situ by plasma-enhanced chemical vapor deposition (PECVD). The second passivation layer introduces carbon and nitrogen atoms into the amorphous silicon film, and the high-temperature annealing treatment can push carbon and nitrogen atoms into the silicon substrate, thus improving the mechanical properties of the silicon wafer.

A third aspect of the present invention provides a silicon-based semiconductor device, which includes the transparent laminated passivation film structure. The transparent laminated passivation film structure can improve the passivation quality of the silicon-based semiconductor device, and the saturation current density of the silicon-based semiconductor device is greatly reduced, which is beneficial for improving the performance of the device.

In summary, compared with the prior art, the present invention has the following beneficial effects:

(1) The transparent laminated passivation film structure of the present invention has excellent surface passivation effect and bulk passivation effect, the saturation current density can be reduced to 0.2 fA/cm$^2$ on the surface of the silicon wafer, and the minority carrier life of the market mainstream n-type silicon wafer bulk can be prolonged to more than 15 ms.

(2) The transparent laminated passivation film structure of the present invention has extremely low optical absorption characteristics, and the absorption at wavelengths above 400 nm is extremely low, and the controllable adjustment of the optical absorption and transmission characteristics can be realized by adjusting the refractive index of the second passivation layer, the film thickness, and the like.

(3) The transparent laminated passivation film structure of the present invention has good chemical stability and thermal stability. The passivation film structure contains elements such as silicon, nitrogen, carbon, and oxygen, which can achieve excellent surface protection for a silicon wafer, and the passivation quality of the silicon wafer will not be affected by temperature in the temperature range below 500° C.

(4) The transparent laminated passivation film structure of the present invention can introduce elements such as carbon, nitrogen, and oxygen into the near surface of the silicon wafer, which is beneficial for improving the mechanical properties of the silicon wafer.

(5) The preparation method of the transparent laminated passivation film structure of the present invention is completely compatible with the prior battery production line technology and has a good mass production application prospect. Other transparent dielectric films can be superimposed on the passivation film structure to form a more complex layer structure.

Numerals of the drawings are described below:

1—silicon substrate, 2—first passivation layer, 3—second passivation layer, and 4—third passivation layer.

DETAILED DESCRIPTION OF THE EMBODIMENTS

In order to make the above objects, features, and advantages of the present invention clearer and more intelligible, the specific examples of the present invention will be detailed below in combination with drawings. It should be noted that the examples below are used only to illustrate the implementation method and typical parameters of the present invention rather than to limit the parameter range of the present invention. Any reasonable change derived therefrom will still fall within the scope of protection of the claims of the present invention.

It should be noted that the endpoints and any values of the ranges disclosed herein are not limited to such accurate ranges or values. These ranges or values should be understood as including values close to these ranges or values. For the numerical ranges, mutual combination can be performed between the endpoint values of each range, between an endpoint value of each range and an individual point value, and between individual point values to form one or more new numerical ranges. These numerical ranges shall be considered as specifically disclosed herein.

Figure 1:
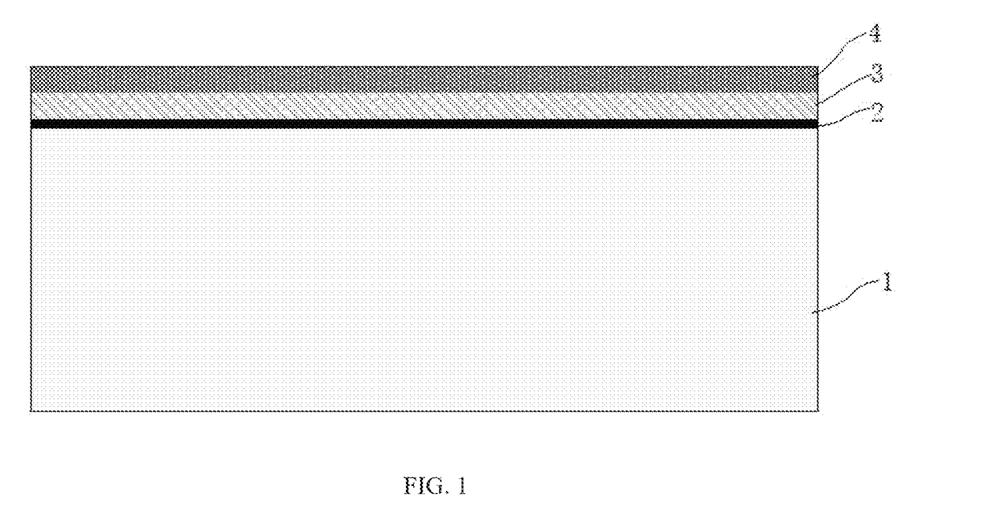
FIG. 1 is a schematic structural diagram of a transparent laminated passivation film structure in specific implementations of the present invention.

A specific example of the present invention provides a transparent laminated passivation film structure, with its typical structure as shown in FIG. 1, which includes a first passivation layer 2, a second passivation layer 3, and a third passivation layer 4 sequentially laminated on a surface of a silicon substrate 1.

The material of the first passivation layer 2 is a hydrogenated silicon oxide film, and its main components are silicon, oxygen, and hydrogen. The hydrogen concentration in the first passivation layer 2 is greater than $1\times10^{19}$ cm$^{-3}$, and the typical hydrogen concentration ranges from $1\times10^{19}$ cm$^{-3}$ to $1\times10^{22}$ cm$^{-3}$. The thickness of the first passivation layer 2 is above 1 nm, with a typical thickness range of 1-20 nm and a preferred thickness range of 1-2 nm. The transmittance of the first passivation layer 2 at wavelengths above 400 nm is more than 97%, and the absorption coefficient k value decreases to near zero at wavelengths above 500 nm, which has extremely low optical absorption characteristics.

The material of the second passivation layer 3 is one selected from a hydrogenated silicon carbon nitride film, a hydrogenated silicon carbide film, a hydrogenated silicon nitride film, a hydrogenated silicon carbon nitride oxide film, a hydrogenated silicon carbide oxide film, and a hydrogenated silicon nitride oxide film, and its main components are silicon, hydrogen, nitrogen, and/or carbon, and it may also contain oxygen. The thickness of the second passivation layer 3 is above 3 nm, with a typical thickness range of 3-50 nm and a preferred thickness range of 5-20 nm. The proportion of carbon, nitrogen, and other elements in the second passivation layer 3 can be adjusted, and its refractive index ranges from 1.0 to 5.0, which can be adjusted according to the composition. The hydrogen concentration in the second passivation layer 3 is greater than $1\times10^{19}$ cm$^{-3}$, and the typical concentration ranges from $1\times10^{19}$ cm$^{-3}$ to $1\times10^{22}$ cm$^{-3}$. The transmittance of the second passivation layer 3 at wavelengths above 400 nm is more than 97%, and the absorption coefficient k value decreases to near zero at wavelengths above 500 nm, which has extremely low optical absorption characteristics.

The third passivation layer 4 is a hydrogen-rich dielectric layer or a combination thereof, including but not limited to hydrogenated aluminum oxide, hydrogenated silicon nitride, hydrogenated silicon oxide, or a composite laminated film thereof. The hydrogen concentration of the third passivation layer 4 ranges from $1\times10^{19}$ cm$^{-3}$ to $1\times10^{22}$ cm$^{-3}$.

The near surface and bulk region of the silicon substrate 1 contain a hydrogen element and at least one of a nitrogen element and a carbon element, and the concentration of the corresponding elements gradually decreases from the surface to the body. In the surface area below the first passivation layer 2, the nitrogen concentration is generally higher than $1\times10^{19}$ cm$^{-3}$, and the typical concentration ranges from $1\times10^{19}$ cm$^{-3}$ to $1\times10^{22}$ cm$^{-3}$, usually exceeding $1\times10^{21}$ cm$^{-3}$. The carbon concentration is generally higher than $1\times10^{19}$ cm$^{-3}$, and the typical concentration ranges from $1\times10^{19}$ cm$^{-3}$ to $1\times10^{22}$ cm$^{-3}$, usually exceeding $1\times10^{21}$ cm$^{-3}$. The hydrogen concentration is generally higher than $1\times10^{19}$ cm$^{-3}$, and the typical concentration ranges from $1\times10^{19}$ cm$^{-3}$ to $1\times10^{21}$ cm$^{-3}$, usually exceeding $1\times10^{20}$ cm$^{-3}$. The introduction of carbon, nitrogen, oxygen, and other elements into the near surface of a silicon wafer can improve the mechanical properties of the silicon wafer. Carbon and nitrogen atoms can effectively capture hydrogen atoms and inject them into the substrate and interface to passivate more defect states.

Figure 2:
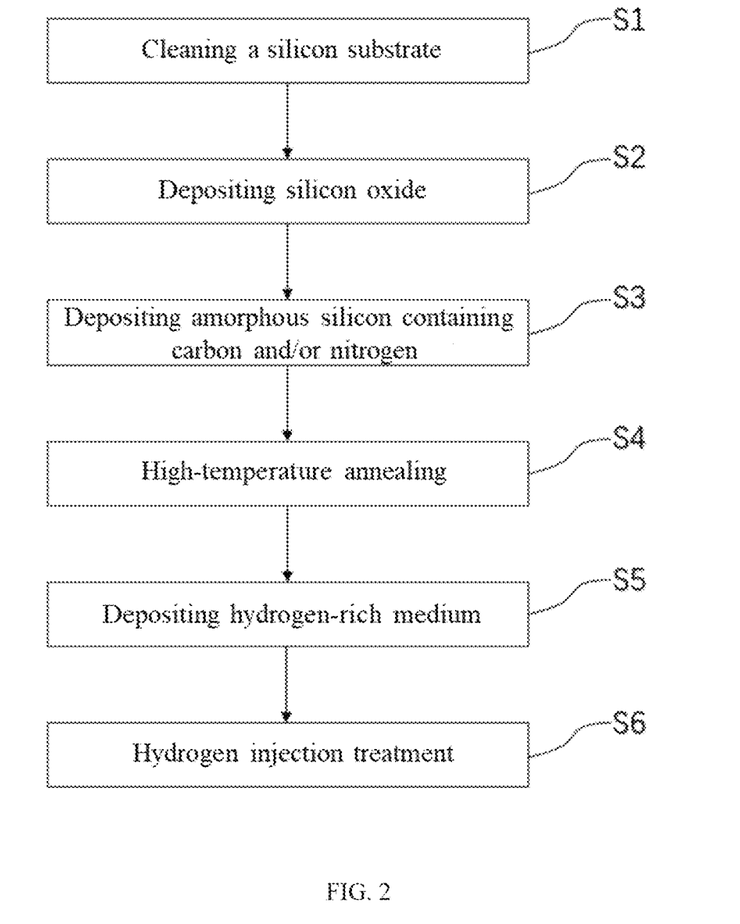
FIG. 2 is a flowchart of a preparation method of the transparent laminated passivation film structure in specific implementations of the present invention.

Referring to FIG. 2, a typical preparation method of the transparent laminated passivation film structure includes the following steps:

S1, performing standard RCA cleaning, developed by the Radio Corporation of America, on a silicon substrate.

S2, preparing a silicon oxide film on a surface of the silicon substrate, where the preparation method includes a wet chemical method, a plasma-assisted oxidation method, a thermal oxidation method, an ozone gas oxidation method, and the like.

S3, depositing an amorphous silicon film containing carbon and/or nitrogen elements on the silicon oxide film, where the typical preparation method is an in-situ PECVD method, and the deposition temperature range is 100° C.-600° C.

S4, carrying out high-temperature annealing treatment, where the typical temperature range is 600° C.-1200° C., and the protective atmosphere is nitrogen, so as to crystallize amorphous silicon and push carbon atoms and/or nitrogen atoms into the silicon substrate.

S5, depositing one or a laminated film of more selected from aluminum oxide, silicon nitride, and silicon oxide on the polycrystalline silicon film.

S6, carrying out hydrogen injection treatment. Preferably, annealing treatment is adopted for hydrogenation; the treatment temperature is 300° C.-1000° C., and the protective atmosphere contains inert gas such as nitrogen, preferably a mixed gas of nitrogen and hydrogen.

According to the preparation method, carbon and nitrogen atoms can be introduced into the silicon wafer bulk, and more hydrogen atoms can be captured at the interface. The transparent laminated passivation film structure achieves excellent surface passivation effect and bulk passivation effect; the saturation current density can be reduced to 0.2 fA/cm$^2$ on the surface of the silicon wafer, and the minority carrier life of the n-type silicon wafer bulk can be prolonged to more than 15 ms.

The transparent laminated passivation film structure is suitable for silicon-based semiconductor devices, and the preparation method is completely compatible with the prior battery production line technology. Other transparent dielectric films can be superimposed on the passivation film structure to form a more complex layer structure to improve the performance of the device.

The technical schemes and technical effects of the present invention will be further described by specific examples.

Example 1

Figure 3:
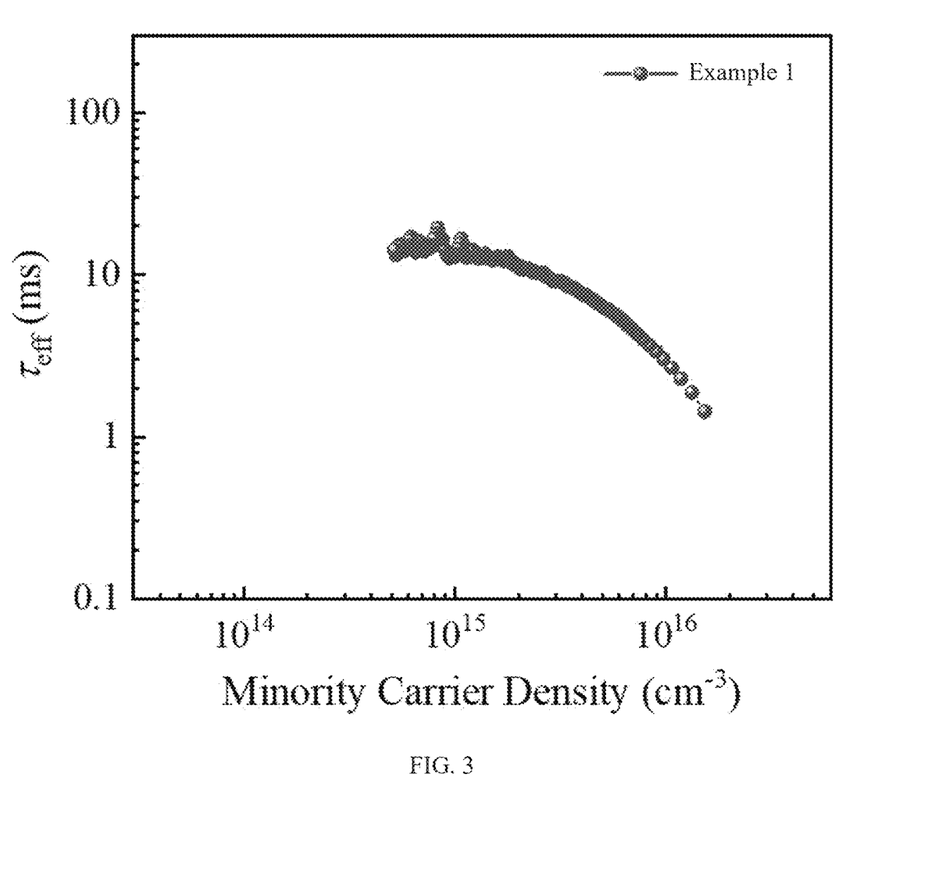
FIG. 3 is a minority carrier lifetime diagram of the sample prepared in Example 1 of the present invention.

An n-type silicon wafer was prepared, which was planar, with a thickness of 110 μm and a resistivity of 1-7 2 cm. The silicon wafer was subjected to standard RCA cleaning and placed in a PECVD chamber. An $SiO_x$ film was prepared by $N_2O$ plasma, and then a nitrogen-rich amorphous silicon film (nitrogen content was 15 at %) was deposited. Annealing at 900° C. for 30 min in a tube furnace. $AlO_x$ was deposited by atomic layer deposition (ALD) and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.3-0.6 $fA/cm^2$. One sample was selected to test the lifetime; the minority carrier lifetime diagram is shown in FIG. 3, and the test result is about 15 ms.

Example 2

An n-type silicon wafer was prepared, which was planar, with a thickness of 110 μm and a resistivity of 1-7 Ω·cm. The silicon wafer was subjected to standard RCA cleaning and placed in a PECVD chamber. An $SiO_x$ film was prepared by $N_2O$ plasma, and then a carbon-rich amorphous silicon film (carbon content was 15 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.5-0.9 $fA/cm^2$.

Example 3

An n-type silicon wafer was prepared, which was planar, with a thickness of 110 μm and a resistivity of 1-7 2 cm. The silicon wafer was subjected to standard RCA cleaning and placed in a PECVD chamber. An $SiO_x$ film was prepared by $N_2O$ plasma, and then a nitrogen- and carbon-rich amorphous silicon film (nitrogen content was 5 at %, carbon content was 10 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.2-0.5 $fA/cm^2$.

Example 4

An n-type silicon wafer was prepared, which was planar, with a thickness of 110 μm and a resistivity of 1-7 Ω·cm. The silicon wafer was subjected to standard RCA cleaning and placed in a PECVD chamber. An $SiO_x$ film was prepared by $N_2O$ plasma, and then a nitrogen- and oxygen-rich amorphous silicon film (nitrogen content was 15 at %, oxygen content was 5 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.2-0.6 $fA/cm^2$.

Example 5

An n-type silicon wafer was prepared, which was planar, with a thickness of 110 μm and a resistivity of 1-7 2 cm. The silicon wafer was subjected to standard RCA cleaning and placed in a PECVD chamber. An $SiO_x$ film was prepared by $N_2O$ plasma, and then a carbon- and oxygen-rich amorphous silicon film (carbon content was 15 at %, oxygen content was 5 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.4-0.8 $fA/cm^2$.

Example 6

An n-type silicon wafer was prepared, which was planar, with a thickness of 110 μm and a resistivity of 1-7 Ω·cm. The silicon wafer was subjected to standard RCA cleaning and placed in a PECVD chamber. An $SiO_x$ film was prepared by $N_2O$ plasma, and then a nitrogen-, carbon-, and oxygen-rich amorphous silicon film (nitrogen content was 5 at %, carbon content was 5 at %, and oxygen content was 5 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.2-0.5 $fA/cm^2$.

Example 7

Figure 5:
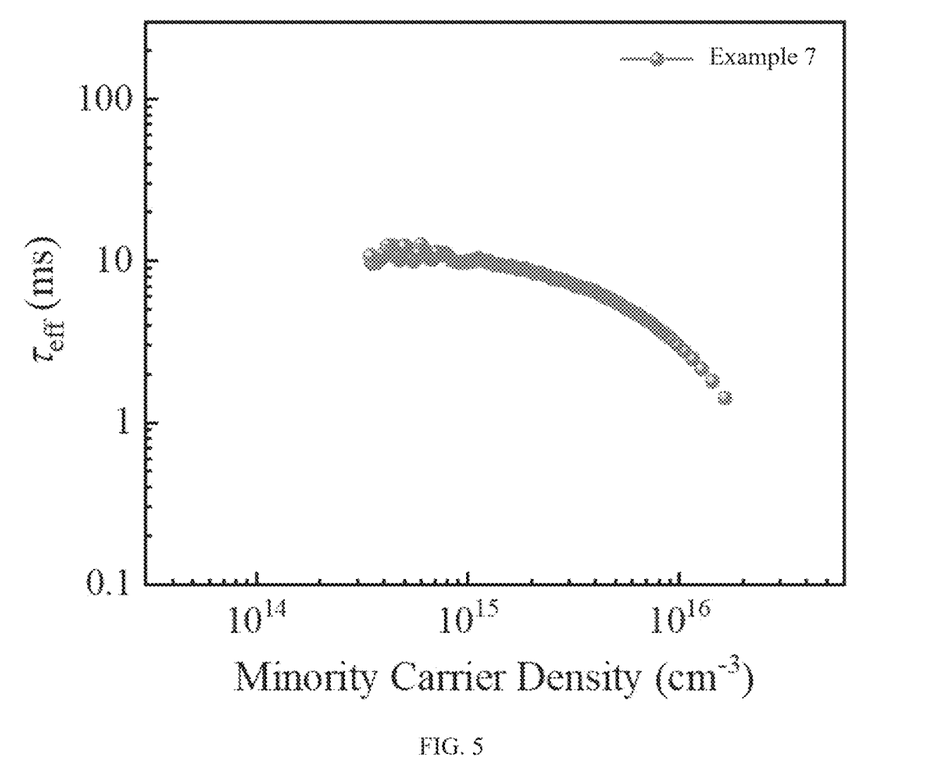
FIG. 5 is a minority carrier lifetime diagram of the sample prepared in Example 7 of the present invention.

An n-type silicon wafer was prepared, which was textured, with a thickness of 200 μm and a resistivity of 1-7 2 cm. The silicon wafer was subjected to standard RCA cleaning and placed in a PECVD chamber. An $SiO_x$ film was prepared by $N_2O$ plasma, and then a nitrogen-rich amorphous silicon film (nitrogen content was 15 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 0.8-1.5 $fA/cm^2$. One sample was selected to test the lifetime; the minority carrier lifetime diagram is shown in FIG. 5, and the test result is about 10 ms.

Example 8

Figure 7:
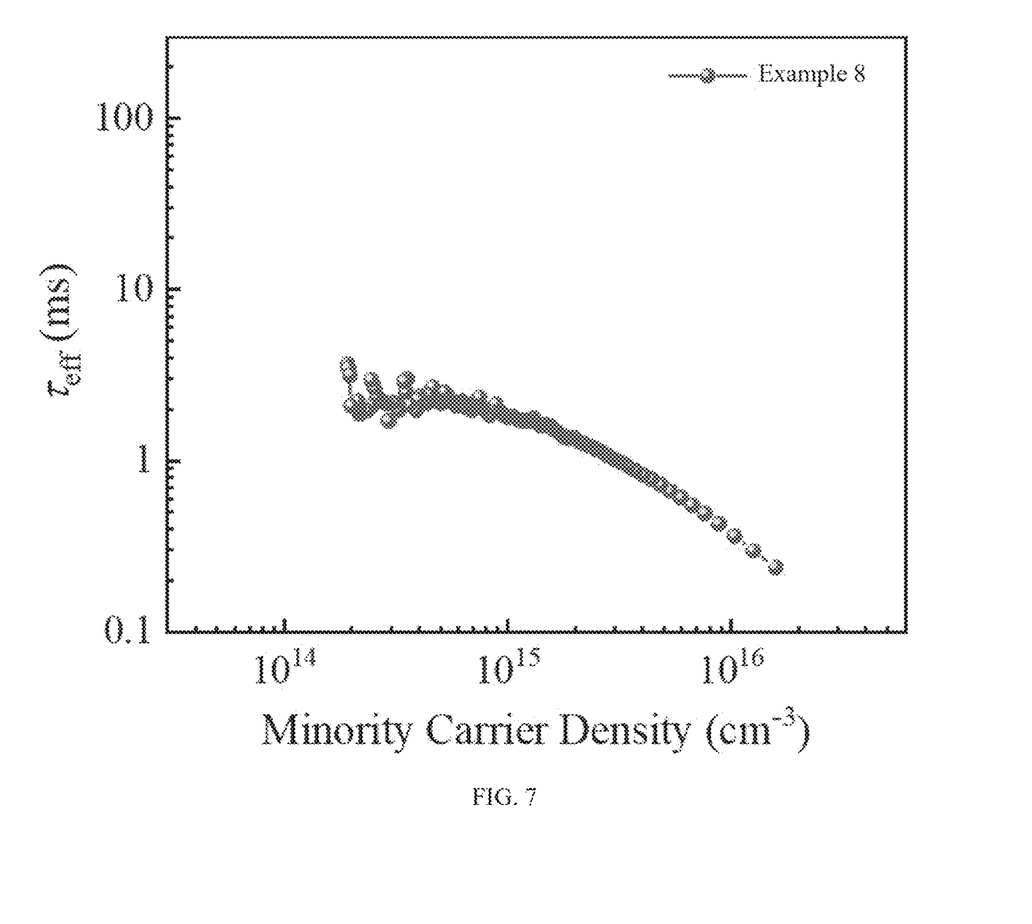
FIG. 7 is a minority carrier lifetime diagram of the sample prepared in Example 8 of the present invention.

A double-sided phosphor diffused p-type silicon wafer was prepared, which was textured, with a thickness of 170 μm and a resistivity of 1-15 Ω·cm. The silicon wafer was subjected to standard RCA cleaning and placed in a PECVD chamber. An $SiO_x$ film was prepared by $N_2O$ plasma, and then a nitrogen-rich amorphous silicon film (nitrogen content was 15 at %) was deposited. Annealing at 900° C. for 30 min in a tube furnace. $AlO_x$ was deposited by ALD and annealed in the tube furnace at 450° C. for 30 min. Then transferred to PECVD to deposit $SiN_x$ and finally annealed at 400° C. for 60 min in the tube furnace in a mixed gas atmosphere of nitrogen and hydrogen. Six samples were prepared, and a Sinton test was performed. The test results of single-sided saturation current density $J_{0,s}$ were in a range of 15-20 $fA/cm^2$. One sample was selected to test the lifetime; the minority carrier lifetime diagram is shown in FIG. 7, and the test result is about 1.8 ms.

Comparative Example 1

Figure 4:
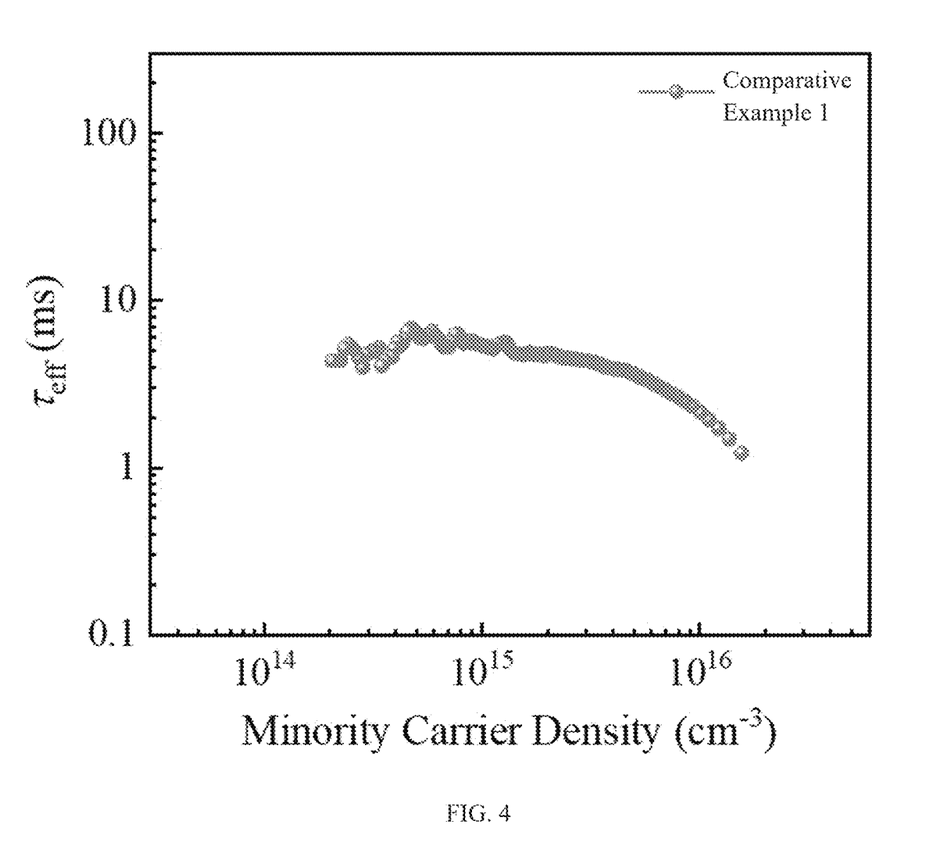
FIG. 4 is a minority carrier lifetime diagram of the sample prepared in Comparative Example 1 of the present invention.

An n-type silicon wafer was prepared, with a thickness of 110 μm and a resistivity of 1-7 Ω·cm. The silicon wafer was subjected to standard RCA cleaning and placed in an ALD chamber to deposit $AlO_x$, then transferred to a tube furnace and annealed at 450° C. for 30 min in a nitrogen atmosphere. Six samples were prepared, and a Sinton test was performed. The test results of single-sided saturation current density $J_{0,s}$ were in a range of 3.0-5.0 $fA/cm^2$. One sample was selected to test the lifetime; the minority carrier lifetime diagram is shown in FIG. 4, and the test result is about 5.6 ms.

Comparative Example 2

An n-type silicon wafer was prepared, with a thickness of 110 μm and a resistivity of 1-7 Ω·cm. The silicon wafer was subjected to standard RCA cleaning and placed in an ALD chamber to deposit $AlO_x$, then transferred to a tube furnace and annealed at 450° C. for 30 min in a nitrogen atmosphere; transferred to PECVD to deposit $SiN_x$; and finally transferred to the tube furnace and annealed at 400° C. for 60 min under a mixed gas of nitrogen and hydrogen. Six samples were prepared, and a Sinton test was performed. The test results of single-sided saturation current density $J_{0,s}$ were in a range of 2.0-4.0 $fA/cm^2$.

Comparative Example 3

An n-type silicon wafer was prepared, with a thickness of 110 μm and a resistivity of 1-7 Ω·cm. The silicon wafer was subjected to standard RCA cleaning and placed in a tube furnace; $SiO_x$ was prepared in an oxygen atmosphere and then transferred to a PECVD chamber to deposit $SiN_x$. Finally, annealed at 400° C. for 60 min in the tube furnace under a mixed gas of nitrogen and hydrogen. Six samples were prepared, and a Sinton test was performed. The test results of single-sided saturation current density $J_{0,s}$ were in a range of 8.0-12.0 $fA/cm^2$.

Comparative Example 4

Figure 6:
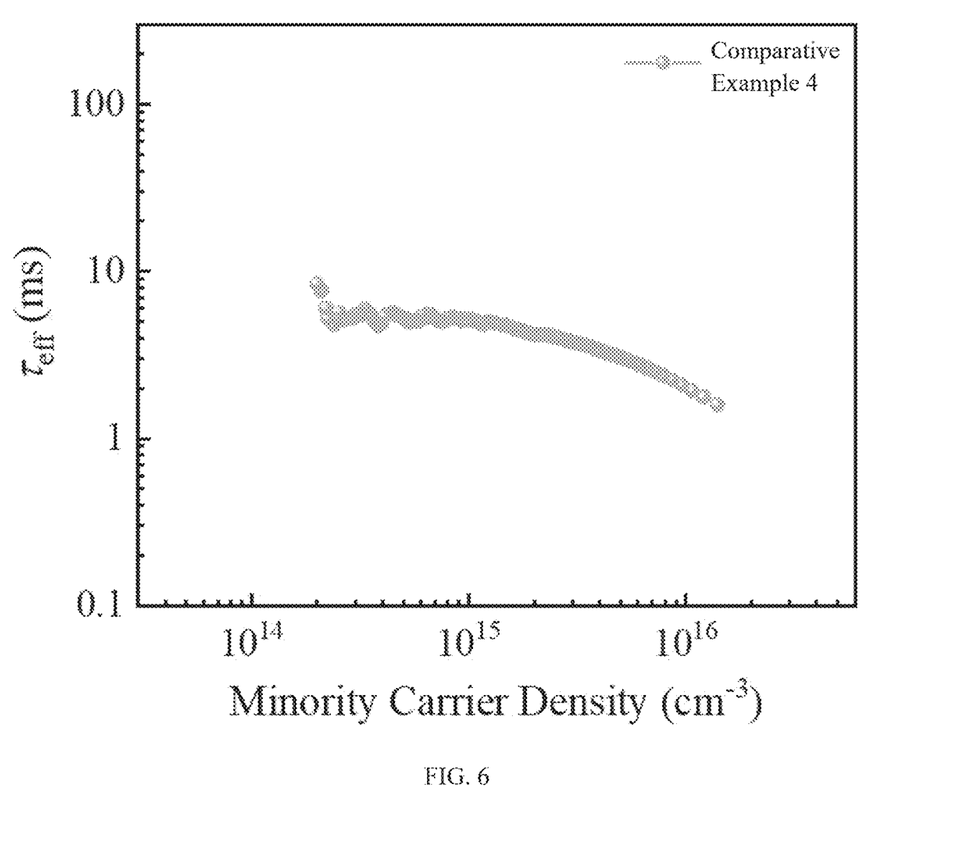
FIG. 6 is a minority carrier lifetime diagram of the sample prepared in Comparative Example 4 of the present invention.

An n-type silicon wafer was prepared, which was textured, with a thickness of 200 μm and a resistivity of 1-7 Ω·cm. The silicon wafer was subjected to standard RCA cleaning and placed in an ALD chamber to deposit $AlO_x$. Then transferred to a tube furnace and annealed at 450° C. for 30 min in a nitrogen atmosphere. Six samples were prepared, and a Sinton test was performed. The test results of single-sided saturation current density $J_{0,s}$ were in a range of 5-10 $fA/cm^2$. One sample was selected to test the lifetime; the minority carrier lifetime diagram is shown in FIG. 6, and the test result is about 5 ms.

Comparative Example 5

Figure 8:
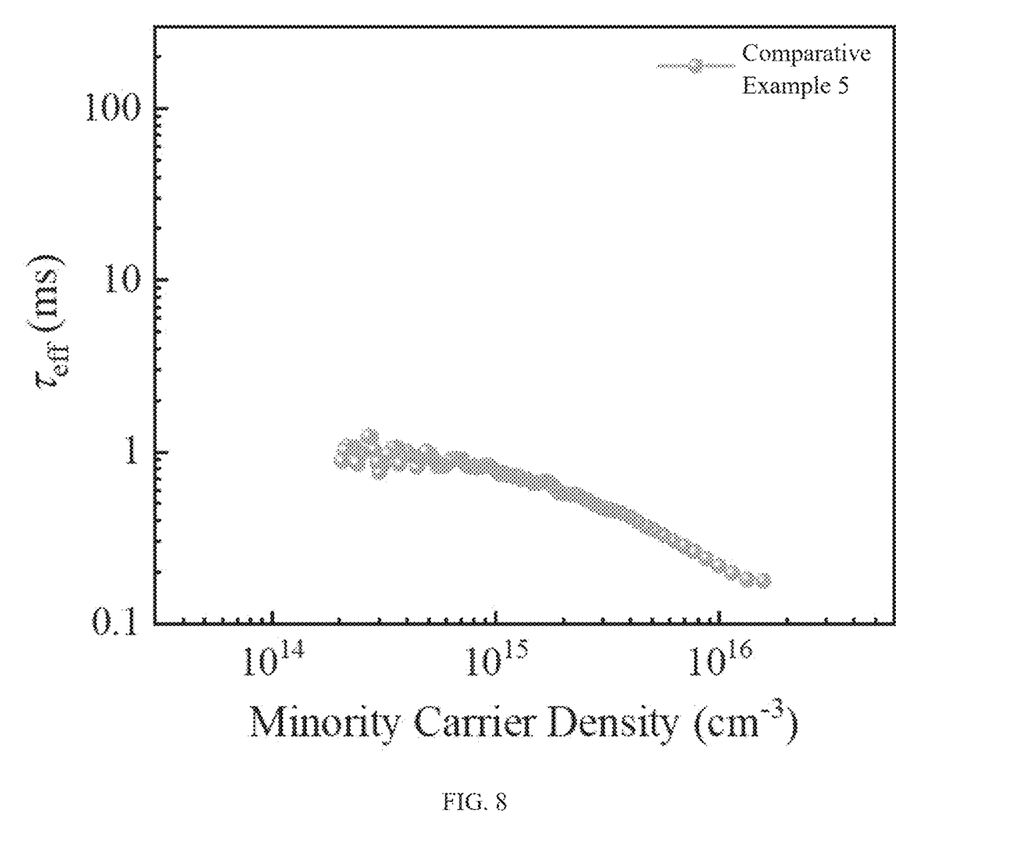
FIG. 8 is a minority carrier lifetime diagram of the sample prepared in Comparative Example 5 of the present invention.

A double-sided phosphor diffused p-type silicon wafer was prepared, which was textured, with a thickness of 170 μm and a resistivity of 1-15 2 cm. The silicon wafer was subjected to standard RCA cleaning and placed in a tube furnace. $SiO_x$ was prepared in an oxygen atmosphere and then transferred to a PECVD chamber to deposit $SiN_x$. Finally, annealed at 400° C. for 60 min in the tube furnace under a mixed gas of nitrogen and hydrogen. Six samples were prepared, and a Sinton test was performed. The test results of single-sided saturation current density $J_{0,s}$ were in a range of 25-35 $fA/cm^2$. One sample was selected to test the lifetime; the minority carrier lifetime diagram is shown in FIG. 8, and the test result is about 0.8 ms.

The test results of single-sided saturation current densities $J_{0,s}$ of the above Examples 1-8 and Comparative Examples 1-5 are shown in Table 1 below. The results show that the transparent laminated passivation film structure of the present invention has an excellent passivation effect and can greatly reduce the saturation current density.

TABLE 1

Comparison of single-sided saturation current density of passivated structures in Examples 1-6 and Comparative Examples 1-3

| | Example 1 | Example 2 | Example 3 | Example 4 | Example 5 | Example 6 | Example 7 | Example 8 |
|---|---|---|---|---|---|---|---|---|
| $J_{0,s}$ ($fA/cm^2$) | 0.3-0.6 | 0.5-0.9 | 0.2-0.5 | 0.2-0.6 | 0.4-0.8 | 0.2-0.5 | 0.5-1.5 | 15-20 |

| | Comparative Example 1 | Comparative Example 2 | Comparative Example 3 | Comparative Example 4 | Comparative Example 5 |
|---|---|---|---|---|---|
| | 3.0-5.0 | 2.0-4.0 | 8.0-12.0 | 5.0-10 | 25-35 |

Although the present invention is disclosed as above, the present invention is not limited hereto. Any person skilled in the arts can make various changes and modifications within the spirit and scope of the present invention. Therefore, the scope of protection of the present invention shall be indicated in the claims.

What is claimed is:

1. A transparent laminated passivation film structure, comprising a first passivation layer, a second passivation layer, and a third passivation layer, wherein the first passivation layer, the second passivation layer, and the third passivation layer are sequentially laminated on a surface of a silicon substrate; wherein a material of the first passivation layer is a hydrogenated silicon oxide film; a material of the second passivation layer is one selected from a hydrogenated silicon carbon nitride film, a hydrogenated silicon carbide film, a hydrogenated silicon nitride film, a hydrogenated silicon carbon nitride oxide film, a hydrogenated silicon carbide oxide film, and a hydrogenated silicon nitride oxide film; a material of the third passivation layer is one or a laminated film of more selected from a hydrogenated aluminum oxide film, a hydrogen-containing silicon nitride film, and the hydrogenated silicon oxide film.

2. The transparent laminated passivation film structure according to claim 1, wherein the silicon substrate comprises a hydrogen element and at least one of a carbon element and a nitrogen element, and a concentration of each element gradually decreases from the surface to a body.

3. The transparent laminated passivation film structure according to claim 2, wherein a hydrogen concentration on the surface of the silicon substrate is $1\times10^{19}$ cm$^{-3}$–$1\times10^{21}$ cm$^{-3}$.

4. The transparent laminated passivation film structure according to claim 3, wherein a nitrogen concentration on the surface of the silicon substrate is $1\times10^{19}$ cm$^{-3}$–$1\times10^{22}$ cm$^{-3}$, and/or a carbon concentration on the surface of the silicon substrate is $1\times10^{19}$ cm$^{-3}$–$1\times10^{22}$ cm$^{-3}$.

5. The transparent laminated passivation film structure according to claim 1, wherein a hydrogen concentration of the first passivation layer is $1\times10^{19}$ cm$^{-3}$–$1\times10^{22}$ cm$^{-3}$, a hydrogen concentration of the second passivation layer is $1\times10^{19}$ cm$^{-3}$–$1\times10^{22}$ cm$^{-3}$, and a hydrogen concentration of the third passivation layer is $1\times10^{19}$ cm$^{-3}$–$1\times10^{22}$ cm$^{-3}$.

6. The transparent laminated passivation film structure according to claim 5, wherein a refractive index of the second passivation layer is 1.0-5.0.

7. The transparent laminated passivation film structure according to claim 5, wherein transmittance of the first passivation layer at wavelengths above 400 nm is greater than 97%, and transmittance of the second passivation layer at the wavelengths above 400 nm is greater than 97%.

8. The transparent laminated passivation film structure according to claim 5, wherein a thickness of the first passivation layer is 1-20 nm, and a thickness of the second passivation layer is greater than or equal to 2 nm.

9. A silicon-based semiconductor device, comprising the transparent laminated passivation film structure according to claim 1.

10. The transparent laminated passivation film structure according to claim 2, wherein a hydrogen concentration of the first passivation layer is $1\times10^{19}$ cm$^{-3}$–$1\times10^{22}$ cm$^{-3}$, a hydrogen concentration of the second passivation layer is $1\times10^{19}$ cm$^{-3}$–$1\times10^{22}$ cm$^{-3}$, and a hydrogen concentration of the third passivation layer is $1\times10^{19}$ cm$^{-3}$–$1\times10^{22}$ cm$^{-3}$.

11. The transparent laminated passivation film structure according to claim 3, wherein a hydrogen concentration of the first passivation layer is $1\times10^{19}$ cm$^{-3}$–$1\times10^{22}$ cm$^{-3}$, a hydrogen concentration of the second passivation layer is $1\times10^{19}$ cm$^{-3}$–$1\times10^{22}$ cm$^{-3}$, and a hydrogen concentration of the third passivation layer is $1\times10^{19}$ cm$^{-3}$–$1\times10^{22}$ cm$^{-3}$.

12. The transparent laminated passivation film structure according to claim 4, wherein a hydrogen concentration of the first passivation layer is $1\times10^{19}$ cm$^{-3}$–$1\times10^{22}$ cm$^{-3}$, a hydrogen concentration of the second passivation layer is $1\times10^{19}$ cm$^{-3}$–$1\times10^{22}$ cm$^{-3}$, and a hydrogen concentration of the third passivation layer is $1\times10^{19}$ cm$^{-3}$–$1\times10^{22}$ cm$^{-3}$.

13. A preparation method of the transparent laminated passivation film structure according to claim 1, comprising the following steps:
   S1, cleaning the silicon substrate;
   S2, preparing a silicon oxide film on the surface of the silicon substrate;
   S3, depositing an amorphous silicon film containing carbon and/or nitrogen elements on the silicon oxide film;
   S4, carrying out a high-temperature annealing treatment at a temperature of 600° C.-1200° C. to convert the amorphous silicon film into a polycrystalline silicon film;
   S5, depositing one or a laminated film of more selected from aluminum oxide, silicon nitride, and silicon oxide on the polycrystalline silicon film; and
   S6, carrying out a hydrogen injection treatment.

14. The preparation method of the transparent laminated passivation film structure according to claim 13, wherein in the step S6, an annealing treatment is adopted for hydrogenation, and a treatment temperature is 300° C.-1000° C.

15. The preparation method of the transparent laminated passivation film structure according to claim 13, wherein in the step S3, the amorphous silicon film containing carbon and/or nitrogen elements is deposited in situ by plasma-enhanced chemical vapor deposition (PECVD).

16. The preparation method of the transparent laminated passivation film structure according to claim 13, wherein in the transparent laminated passivation film structure, the silicon substrate comprises a hydrogen element and at least one of a carbon element and a nitrogen element, and a concentration of each element gradually decreases from the surface to a body.

17. The preparation method of the transparent laminated passivation film structure according to claim 16, wherein in the transparent laminated passivation film structure, a hydrogen concentration on the surface of the silicon substrate is $1\times10^{19}$ cm$^{-3}$–$1\times10^{21}$ cm$^{-3}$.

18. The preparation method of the transparent laminated passivation film structure according to claim 17, wherein in the transparent laminated passivation film structure, a nitrogen concentration on the surface of the silicon substrate is $1\times10^{19}$ cm$^{-3}$–$1\times10^{22}$ cm$^{-3}$, and/or a carbon concentration on the surface of the silicon substrate is $1\times10^{19}$ cm$^{-3}$–$1\times10^{22}$ cm$^{-3}$.

19. The preparation method of the transparent laminated passivation film structure according to claim 13, wherein in the transparent laminated passivation film structure, a hydrogen concentration of the first passivation layer is $1\times10^{19}$ cm$^{-3}$–$1\times10^{22}$ cm$^{-3}$, a hydrogen concentration of the second passivation layer is $1\times10^{19}$ cm$^{-3}$–$1\times10^{22}$ cm$^{-3}$, and a hydrogen concentration of the third passivation layer is $1\times10^{19}$ cm$^{-3}$–$1\times10^{22}$ cm$^{-3}$.

20. The preparation method of the transparent laminated passivation film structure according to claim 19, wherein in the transparent laminated passivation film structure, a refractive index of the second passivation layer is 1.0-5.0.

* * * * *